(12) United States Patent
Vadakkanmaru Veedu et al.

(10) Patent No.: US 12,342,454 B2
(45) Date of Patent: Jun. 24, 2025

(54) COMPUTING SYSTEM WITH COOLING FOR CONTROLLING TEMPERATURE OF ELECTRONIC COMPONENTS

(71) Applicant: MICROSOFT TECHNOLOGY LICENSING, LLC, Redmond, WA (US)

(72) Inventors: Unnikrishnan Vadakkanmaru Veedu, Chandler, AZ (US); Silvia Anali Soto De La Torre, Seattle, WA (US); Alexander Lyakhov, Portland, OR (US); Krishna Bharath, Phoenix, AZ (US); Fenghua Shen, Bellevue, WA (US); Madhavi Tadepalli, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 320 days.

(21) Appl. No.: 17/831,726

(22) Filed: Jun. 3, 2022

(65) Prior Publication Data

US 2023/0397325 A1 Dec. 7, 2023

(51) Int. Cl.
*H05K 1/02* (2006.01)
*H01L 23/467* (2006.01)
*H05K 7/20* (2006.01)

(52) U.S. Cl.
CPC ......... *H05K 1/0262* (2013.01); *H01L 23/467* (2013.01); *H05K 1/0203* (2013.01); *H05K 7/20154* (2013.01)

(58) Field of Classification Search
CPC ..... H05K 1/0203–0204; H05K 1/0207; H05K 1/0209; H05K 1/181;
(Continued)

(56) References Cited

U.S. PATENT DOCUMENTS 6,837,719 B2 1/2005 Panella
8,498,117 B2 7/2013 Andric et al.
(Continued)

OTHER PUBLICATIONS

"B550 Aorus Pro (Rev. 1.0)", Retrieved From: https://web.archive.org/web/20210511142856/https://www.gigabyte.com/Motherboard/B550-AORUS-PRO-rev-10, May 11, 2021, 21 Pages.
(Continued)

*Primary Examiner* — Amir A Jalali
(74) *Attorney, Agent, or Firm* — Shook, Hardy & Bacon L.L.P.

(57) ABSTRACT

Technology is disclosed for a computing system with a printed circuit board having a top and bottom; an integrated circuit component coupled to the top of the board; a passive heat exchanger coupled to the top of the board and spaced from the integrated circuit component; at least one electronic component coupled to the printed circuit board below the top of the printed circuit board; and at least one heat pipe having an evaporator end adjacent the electronic component and extending away from the evaporator end along the bottom of the board to a condenser end above the top of the board, the condenser end being thermally coupled to the passive heat exchanger on the top of the board; wherein heat from electronic component is moved away from the electronic component and the integrated circuit component to the passive heat exchanger.

20 Claims, 6 Drawing Sheets

(58) Field of Classification Search
CPC ... H05K 7/1488–1489; H05K 7/20154; H05K 7/2029; H05K 7/20236; H05K 7/20254; H05K 7/20272; H05K 7/20309–20327; H05K 7/20509; H05K 7/20627–20645; H05K 7/20663; H05K 7/20681; H05K 7/207; H05K 7/20709; H05K 7/20718; H05K 7/20736; H05K 7/20754; H05K 7/20763–30781; H05K 7/20818; H05K 7/20827; H05K 7/20836; H05K 7/20881; H05K 7/209; H05K 7/20936; H01L 23/31; H01L 23/34; H01L 23/36; H01L 23/3677; H01L 23/3733; H01L 23/3737; H01L 23/4006; H01L 23/405; H01L 23/4062; H01L 23/467; H01L 23/473

See application file for complete search history.

(56) References Cited

U.S. PATENT DOCUMENTS

| | | | | |
|---|---|---|---|---|
| 10,548,239 | B1* | 1/2020 | Iyengar | G06F 1/20 |
| 2003/0051859 | A1* | 3/2003 | Chesser | H05K 7/20809 |
| | | | | 165/46 |
| 2005/0284614 | A1* | 12/2005 | Machiroutu | F28D 15/025 |
| | | | | 257/E23.088 |
| 2006/0126297 | A1* | 6/2006 | Belady | H05K 1/141 |
| | | | | 257/E23.102 |
| 2006/0187646 | A1* | 8/2006 | Belson | H05K 1/141 |
| | | | | 361/719 |
| 2006/0274513 | A1* | 12/2006 | Panella | H05K 1/0262 |
| | | | | 257/691 |
| 2007/0139880 | A1* | 6/2007 | Ouyang | G06F 1/206 |
| | | | | 361/689 |
| 2008/0006037 | A1* | 1/2008 | Scott | H01L 23/473 |
| | | | | 257/E23.098 |
| 2008/0099189 | A1* | 5/2008 | Suh | F28D 15/06 |
| | | | | 165/104.21 |
| 2009/0129020 | A1* | 5/2009 | Fujiwara | G06F 1/203 |
| | | | | 361/697 |
| 2012/0285003 | A1* | 11/2012 | Ekstedt | H05K 7/20681 |
| | | | | 29/592.1 |
| 2013/0209901 | A1* | 8/2013 | Breit | H01M 8/04074 |
| | | | | 429/410 |
| 2017/0303441 | A1* | 10/2017 | Farshchian | F28F 21/089 |
| 2020/0006287 | A1* | 1/2020 | Hill | H01L 23/13 |
| 2020/0391266 | A1 | 12/2020 | Moore et al. | |
| 2021/0208647 | A1* | 7/2021 | Macias | H05K 7/20772 |

OTHER PUBLICATIONS

"How a Motherboard Handles Power?", Retrieved From: https://global.aorus.com/blog-detail.php?i=925, Mar. 12, 2021, 11 Pages.

Elnaggar, et al., "Heat Pipes for Computer Cooling Applications", In Publication of IntechOpen, Jun. 15, 2016, 28 Pages.

"International Search Report and Written Opinion Issued in PCT Application No. PCT/US23/018778", Mailed Date: Jul. 13, 2023, 13 Pages.

* cited by examiner

COMPUTING SYSTEM WITH COOLING FOR CONTROLLING TEMPERATURE OF ELECTRONIC COMPONENTS

BACKGROUND

Computing devices typically have a printed circuit board, such as a mother board, with an integrated circuit component or processor, such as a central processing unit, or a system on a chip (SoC) and other electronic components, such as a voltage regulator. In a traditional configuration, the electronic components are placed on top of the mother board. Traditionally, the voltage regulator is placed on top of the mother board adjacent to the processor. These components produce heat, and are typically cooled with air flow on top of the mother board from the fans in the server systems.

There is a need to free up space on top of the mother board that can be used by other components. Additionally, there is a need to improve the current path resistance on the mother board, especially between the processor and the voltage regulator.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

Embodiments described in the present disclosure are directed towards technologies for improving current path resistance on a printed circuit board (such as between the processor and the voltage regulator), reducing power loss and lowering the total cost of ownership of the computing system (such as a server system). In particular, embodiments provide cooling technology allowing placement of a voltage regulator on the bottom side of the printed circuit board while providing cooling of the voltage regulator and processor below any critical thresholds. Such technologies improve the efficiency of the server systems.

BRIEF DESCRIPTION OF THE DRAWINGS

Aspects of the disclosure are described in detail below with reference to the attached drawing figures, wherein.

DETAILED DESCRIPTION

The subject matter of aspects of the present disclosure is described with specificity herein to meet statutory requirements. However, the description itself is not intended to limit the scope of this patent. Rather, the inventors have contemplated that the claimed subject matter might also be embodied in other ways, in conjunction with other present or future technologies.

Aspects of the present disclosure relate to a computing system that includes a printed circuit board having a top and a bottom; an integrated circuit component (such as a processor) coupled to the top of the printed circuit board; a passive heat exchanger (such as a heat sink) coupled to the top of the printed circuit board and having at least a portion spaced from the integrated circuit component; at least one electronic component (such as a voltage regulator) coupled to the printed circuit board below the top of the printed circuit board; and at least one heat pipe having an evaporator end adjacent the at least one electronic component, the heat pipe extending away from the evaporator end and along the bottom of the printed circuit board to a condenser end above the top of the printed circuit board, the condenser end being thermally coupled to the passive heat exchanger on the top of the printed circuit board; wherein heat from electronic component is moved away from the electronic component and the integrated circuit component to the passive heat exchanger.

Figure 1:
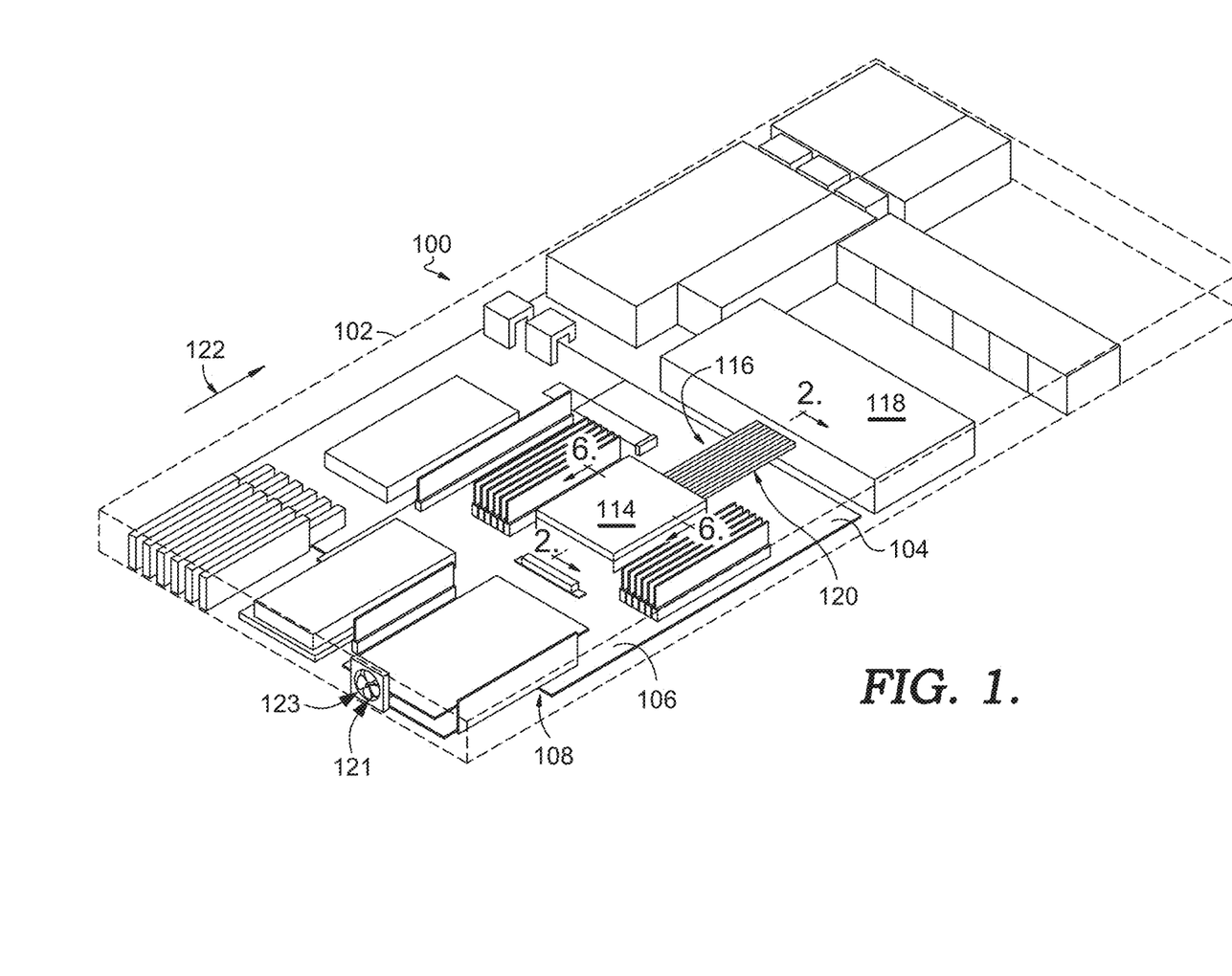
FIG. 1 is a schematic perspective view of a server chassis and components, in accordance with an embodiment of the present disclosure.
Figure 2:
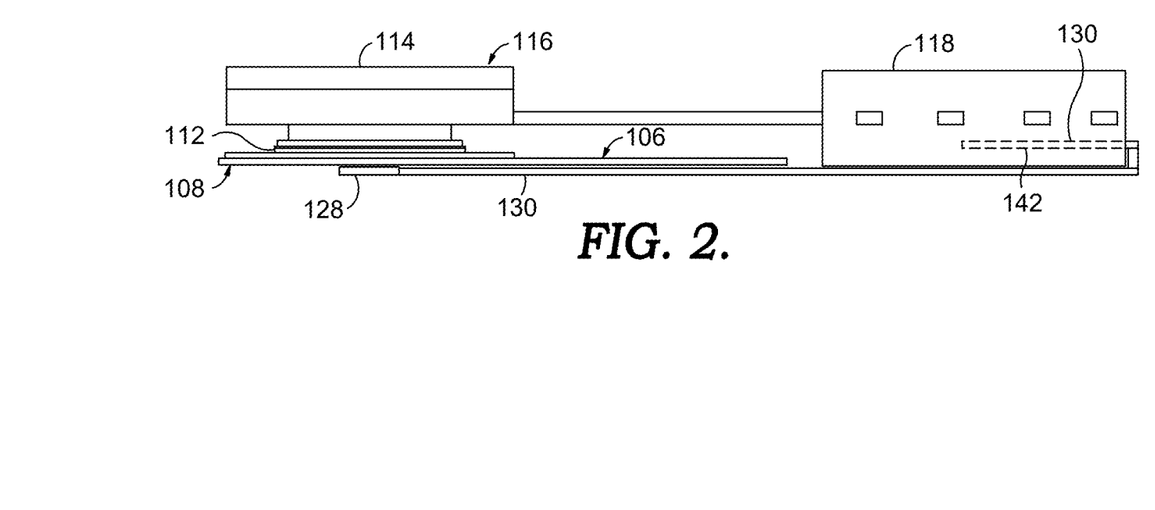
FIG. 2 is a partial cross-sectional view along line 2-2 of FIG. 1.

Turning now to FIG. 1, a perspective view of a computing system, such as a server, 100 is shown in which some embodiments of the present disclosure may be employed. It should be understood that this and other arrangements described herein are set forth only as examples. Other arrangements and elements (e.g., components, interfaces, connections) can be used in addition to or instead of those shown, and some elements may be omitted altogether for the sake of clarity. The server 100 has components held within a chassis 102. Certain components of server 100 are shown, but are well-known and so will not be discussed in detail. However, the server 100, in some aspects, includes a printed circuit board 104, which may be a mother board. The printed circuit board 104 has a top 106 and a bottom 108 (as best seen in FIG. 2). The printed circuit board 104 has a number of components coupled to it. As seen only in FIG. 6, an integrated circuit component 110 is coupled to the top of the printed circuit board 104. In some aspects, the integrated circuit component 110 is a CPU coupled to the printed circuit board 104. In other aspects, the integrated circuit component 106 is a SoC coupled to the printed circuit board via a ball grid array (BGA) connection. The integrated circuit component 110 is one of the components of the server 100 that generates heat, which needs to be moved away from the integrated circuit component 110, and dissipated. The various components shown in the figures, and discussed herein, are not shown to scale, and may have other shapes, sizes and configurations, depending on the design of the printed circuit board 104.

Figure 6:
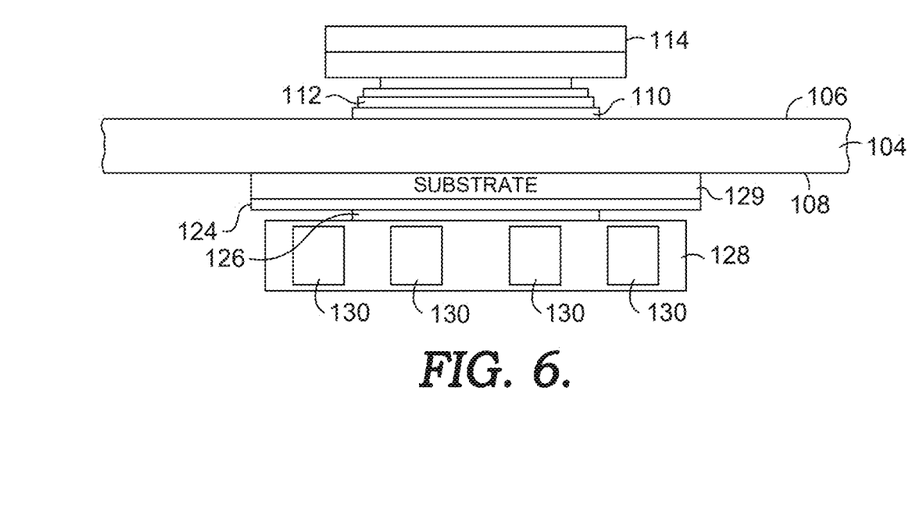
FIG. 6 depicts a partial cross-section along line 6-6 of FIG. 1, in accordance with an embodiment of the present disclosure.

As seen in FIGS. 2 and 6, a heat spreader 112 is disposed above the integrated circuit component 110 and above the heat spreader 112 is a first portion 114 of a passive heat exchanger 116. The heat spreader 112 transfers heat energy from the integrated circuit component 110 to the first portion 114 of the heat exchanger 116. The first portion 114 of the heat exchanger 116 is coupled to a second portion 118 of the heat exchanger 116 via a number of heat pipes 120. The heat pipes 120 have one end adjacent the integrated circuit component 110 and the other end extending into the second portion 118. The second portion 118 is thus remote from the integrated circuit component 110 and the first portion 114. This configuration of the passive heat exchanger 116 saves space above the integrated circuit component 110 within the chassis 102, as compared to integral heat exchangers placed above the integrated circuit component 110. In some aspects, the second portion 118 is a heat sink radiator assembly that dissipates the heat as air is circulated over it (such as by fan(s) 121 within the server 100). The fans move air through chassis 102 in the direction of arrow 122, as seen in FIG. 1.

Figure 3:
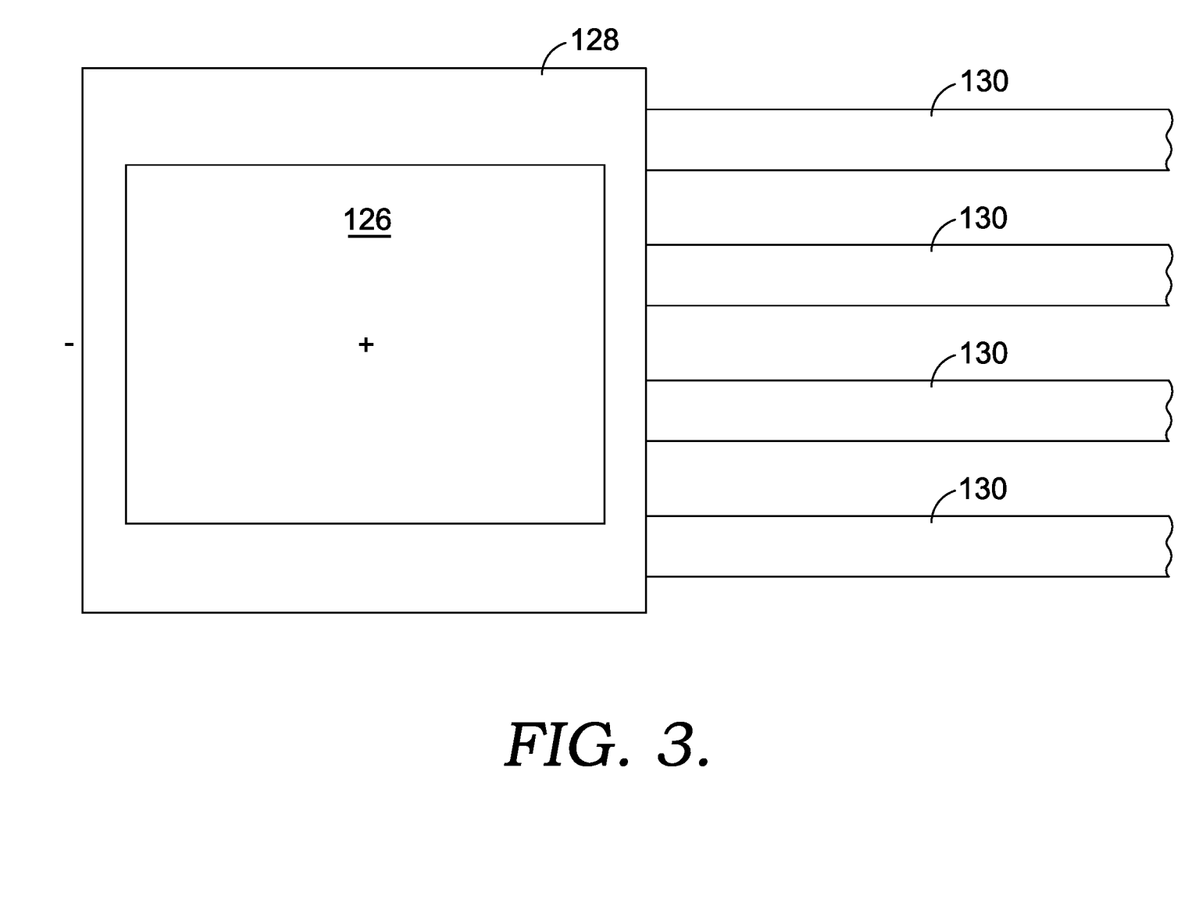
FIG. 3 is a partial top plan view of a portion of a heat pipe construction used in the computing system of FIG. 1, in accordance with an embodiment of the present disclosure.
Figure 4:
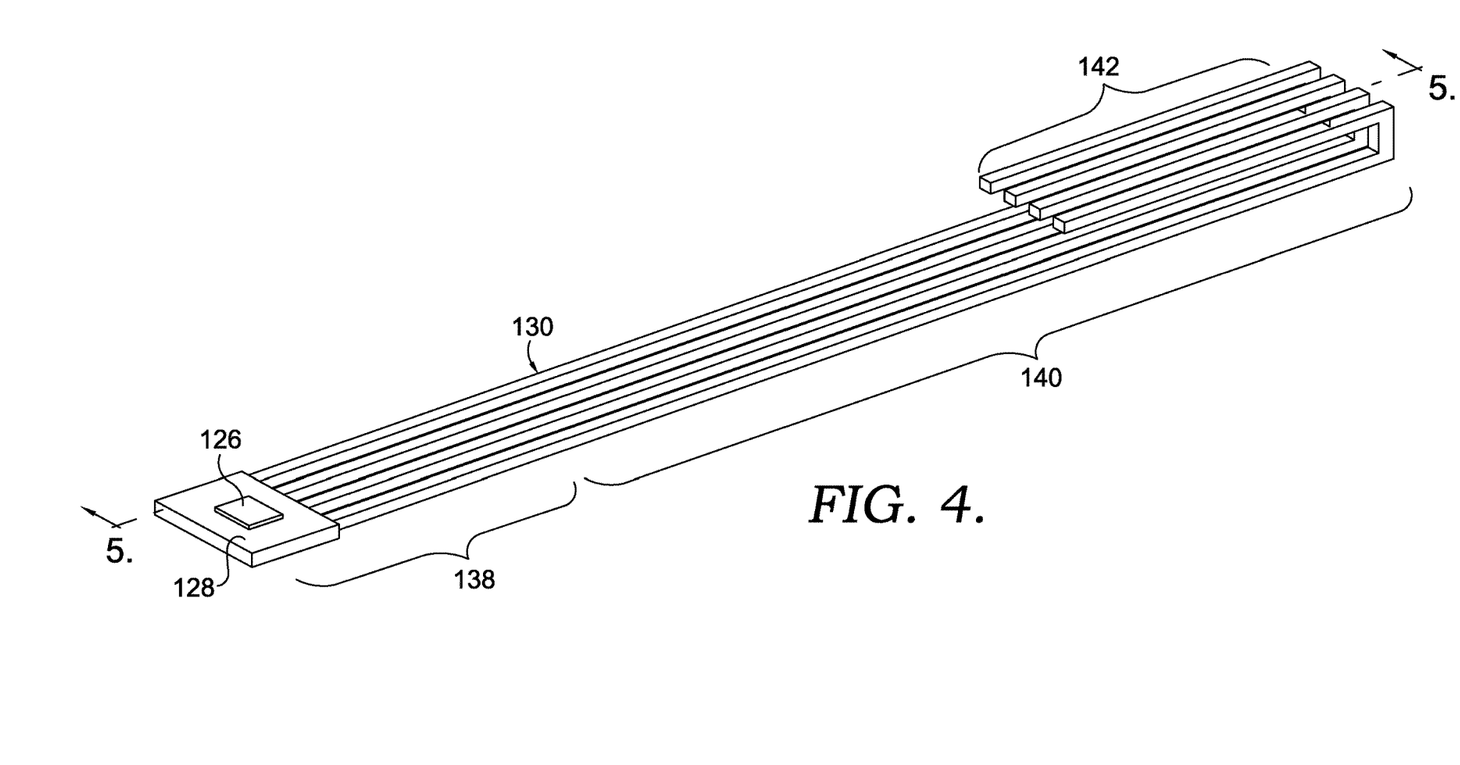
FIG. 4 is a perspective view of a heat pipe construction used in the computing system of FIG. 1, in accordance with an embodiment of the present disclosure.
Figure 5:
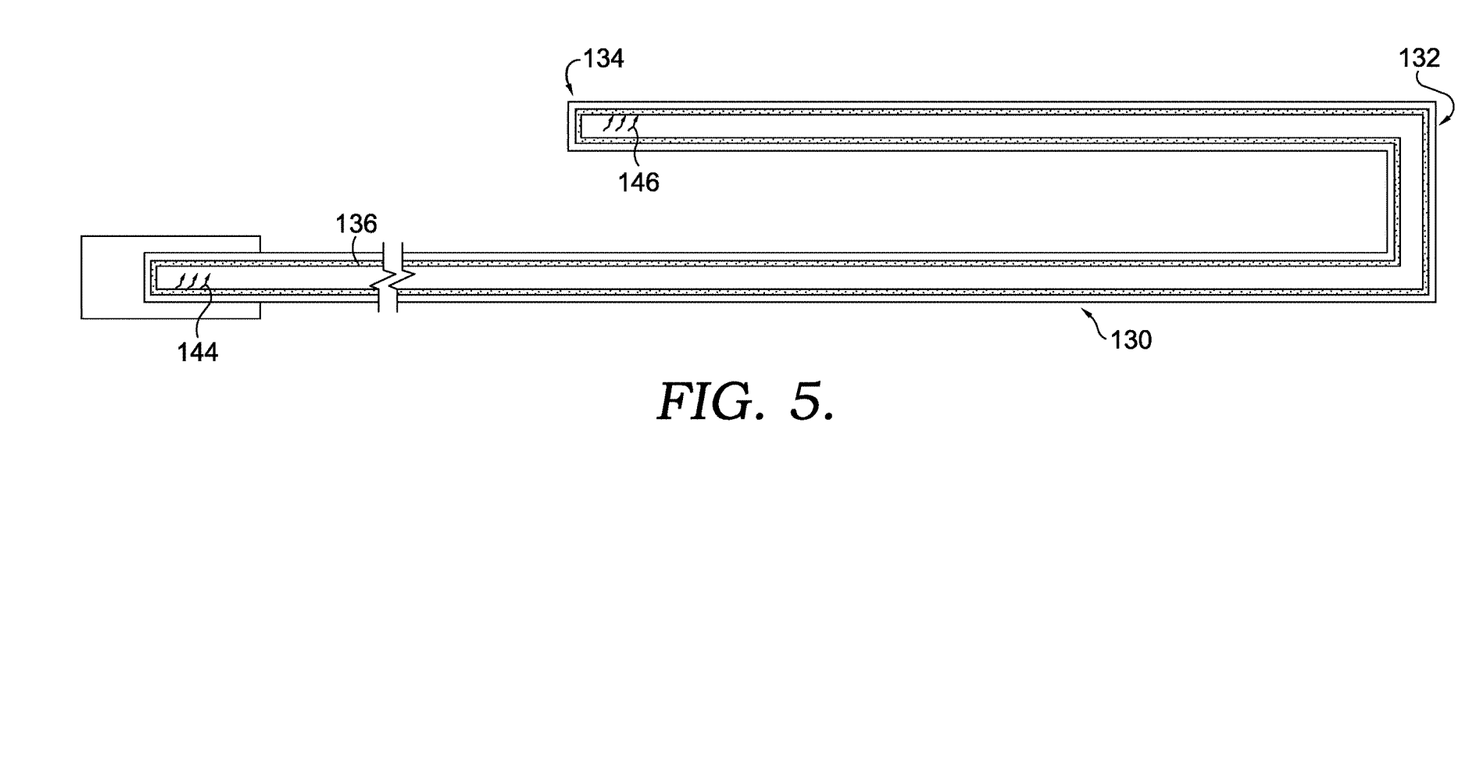
FIG. 5 depicts a cross-sectional view of a heat pipe of FIG. 4, in accordance with an embodiment of the present disclosure.

As best seen in FIG. 6, an electronic component 124 is coupled to the bottom 108 of the printed circuit board 104. In some aspects, the electronic component 124 is a voltage regulator. In some aspects the voltage regulator may be directly coupled to the bottom 108 of the printed circuit board. In other aspects, the voltage regulator is coupled to a substrate 129 that sits between the voltage regulator and the bottom 108 of the printed circuit board 104. As best seen in FIGS. 3 and 6, a thermal interface material (TIM) layer 126 is disposed, in some aspects, between the electronic component 124 and a heat spreader layer 128. In some aspects, the heat spreader layer 128 is a copper spreader. At least one heat pipe 130 is coupled to the heat spreader layer 128. The heat spreader layer 128 is thus thermally connected to the electronic component 124 through the TIM layer 126. As shown in the figures, in some aspects, there are four heat pipes 130. In some aspects, one end of the heat pipes 130 may be embedded within the heat spreader layer 128, as shown in FIG. 6. The heat pipes 130 extend along the bottom 108 of the printed circuit board 104 and along the bottom of the second portion 118 of the passive heat exchanger 116. As best seen in FIGS. 2, 4 and 5, the heat pipes 130, in some aspects, have a turn section 132 that reverses the direction of the heat pipes 130. A distal end portion 134 extends away from the turn section 132 and, in some aspects, extends into the second portion 118 of the passive heat exchanger 116. While the turn section 132 is shown having right angles, other shapes could also be used, such as a smooth, curved u-shape. Further, while the distal end portion 134 is shown embedded within the second portion 118 of the passive heat exchanger 116, the distal end portion 134 may also be located near, or adjacent the second portion 118. In this way, the heat pipes 130 reuse the second portion 118 of the passive heat exchanger 116 to dissipate heat from the bottom of the printed circuit board 104.

With reference to FIG. 5, in some aspects, the heat pipes 130 may be formed from a hollow copper cylinder and have an internal wick 136 and are filled with a working fluid, which, in some aspects, is water. The wick 136 operates as a pump using capillary pressure to move the working fluid within the heat pipe 130. In operation, the heat pipes 130 have an evaporator portion 138, an adiabatic portion 140 and a condenser portion 142. While FIG. 5 indicates regions for each of the evaporator portion 138, adiabatic portion 140 and condenser portion 142, it should be understood that the boundaries for these regions are not precisely defined, and the brackets shown in FIG. 5 are merely there to aid in the discussion of each portion. In some aspects, the evaporator portion 138 is located within and adjacent the heat spreader layer 128 below the top of the printed circuit board 104. In the evaporator portion 138, heat enters the heat pipe 130 from the voltage regulator 124 by conduction, where it causes the working fluid to vaporize, as indicated by arrows 144 in FIG. 5. As the working fluid vaporizes, it moves into the adiabatic portion 140, carried towards the distal end portion 134 by a pressure gradient. The working fluid (now vaporized) travels from the evaporator portion 138, through the adiabatic portion 140 and to the condenser portion 142 on the top side of the printed circuit board 104. Because the condenser portion 142 is embedded in (or is adjacent to) the second portion 118 of the passive heat exchanger 116 on top of the printed circuit board 104, the vaporized working fluid condenses in the lower temperature (cooled by air flow from internal fans), releasing the heat and changing state back to a liquid (as indicated by arrows 146 in FIG. 5). The condensed working fluid is then drawn back into the wick 136 and is returned to the evaporator portion 138 within the wick 136 by capillary action. Since the actual heat transfer from the voltage regulator (electronic component 124) to the heat sink area (second portion 118 of the passive heat exchanger 116) happens through the vapor flow inside the heat pipes 118, the heat can be transferred effectively with minimum temperature drop.

This configuration provides a computing system, such as server 100, that allows an electronic component 124 (such as a voltage regulator) to be located below the top 106 of the printed circuit board 104, while effectively dissipating the heat generated by the voltage regulator 124 (and, in some aspects, the integrated circuit component 110) by moving the heat to the second portion 118 of the passive heat exchanger 116. The two part passive heat exchanger 116 allows a larger heat sink to be used within the limited space of the chassis 102, using the remote portion (second portion 118) in the passive heat exchanger. By locating the electronic component 124 below the top of 106 of the printed circuit board 104, a lower DC current path resistance between the electronic component 124 and the integrated circuit component 110 is achieved. This lowers the printed circuit board 104 load line and increases end to end efficiency, resulting in a reduced power loss and a significant reduction in the total cost of ownership of the server system in which server 100 is used. With the electronic component 124 on the backside of the printed circuit board 104, the heat generated is effectively moved to the passive heat exchanger 116 through heat pipes 130, even though the air flow on the bottom of the printed circuit board 104 is very limited.

The computing system and the cooling system described above effectively allow the voltage regulator to be placed below the top of the printed circuit board 104 (such as on the bottom 108 of the printed circuit board 104). Each of the electronic component 124 (such as a voltage regulator) and the integrated circuit component 110 (such as the CPU) typically has a temperature limit, and the design of the computing system needs to be such that a steady state operation will keep these components below that temperature limit. In some embodiments, the temperature limit for the voltage regulator and the CPU is 100 degrees Celsius and the system design would preferably keep all components below this temperature. The above-described system was modeled to understand the effect, on the voltage regulator temperature and the CPU temperature at a steady state condition, of various voltage regulator power dissipation (in Watts (W)), heat pipe conductivity (in Watts per meter Kelvin (W/mK) and voltage regulator size (mm×mm). In the following example models, an air flow through the chassis 102 was assumed to be 105 cubic feet per minute, with an inlet temperature of 35 degrees Celsius and a CPU power of 291 W.

In a first example, the heat pipe conductivity was changed, and the voltage regulator size and power were kept constant. In this example, as shown below in Table 1.1, the CPU temperature remained between 70 and 71 degrees Celsius, and the voltage regulator die temperature remained between about 55 and 95 degrees Celsius; thus below the limit of about 100 degrees Celsius, even for a heat pipe with lower conductivity of 1,000 W/mK.

TABLE 1.1

| VR dimensions | VR Power | Heat Pipe Conductivity (W/mK) | CPU Temp (C.) | Voltage Regulator Temp (C.) |
|---|---|---|---|---|
| 10 × 10 mm² | 40 W | 1,000 | 70.8 | 95.8 |
| | | 5,000 | 70.9 | 78.6 |
| | | 10,000 | 70.9 | 71.2 |
| | | 50,000 | 70.6 | 62.6 |

In a second example, the voltage regulator power dissipation was changed, and heat pipe conductivity and voltage regulator size were kept constant. In this example, as shown below in Table 1.2, the CPU temperature remained between 70 and 71 degrees Celsius, and the voltage regulator die temperature remained between about 55 and 75 degrees Celsius; well below the limit of about 100 degrees Celsius, even with a voltage regulator power dissipation of 80 W.

TABLE 1.2

| VR dimensions | Heat Pipe Conductivity (W/mK) | VR Power (W) | CPU Temp (C.) | Voltage Regulator Temp (C.) |
|---|---|---|---|---|
| 10 × 10 mm² | 50,000 | 20 | 70.1 | 56.1 |
| | | 40 | 70.6 | 62.6 |
| | | 60 | 70.9 | 68.3 |
| | | 80 | 70.9 | 73.2 |

In a third example, the voltage regulator size was changed, and the voltage regulator power dissipation and heat pipe conductivity were kept constant. In this example, as shown below in Table 1.3, the CPU temperature remained between 70 and 71 degrees Celsius, and the voltage regulator die temperature remained between about 60 and 75 degrees Celsius; still below the limit of about 100 degrees Celsius, even with a smaller size voltage regulator of 5×5 mm, which is typically harder to cool.

TABLE 1.3

| VR Power | Heat Pipe Conductivity (W/mK) | VR dimensions (mm × mm) | CPU Temp (C.) | Voltage Regulator Temp (C.) |
|---|---|---|---|---|
| 40 W | 50,000 | 5 × 5 | 70.8 | 75.6 |
| | | 10 × 10 | 70.6 | 62.6 |
| | | 20 × 20 | 70.2 | 59.9 |

Accordingly, the system therefore allows greater freedom in design of the printed circuit board 104, allowing different sizes of voltage regulators to be used while maintaining the temperature below a critical performance threshold. We have described various aspects of technology directed to a cooling system that allows placement of the electronic component 124 (such as a voltage regulator) on the bottom on the printed circuit board 104, while maintaining temperatures for the electronic component 124 and the integrated circuit component 110 below temperature thresholds. It is understood that various features, sub-combinations, and modifications of the embodiments described herein are of utility and may be employed in other embodiments without reference to other features or sub-combinations. Such variations and combinations thereof are also contemplated to be within the scope of embodiments of this disclosure.

In some embodiments, a computing system, such as the computing system described in any of the embodiments above, comprises: a printed circuit board having a top and a bottom; an integrated circuit component coupled to the top of the printed circuit board; a passive heat exchanger coupled to the top of the printed circuit board and having at least a portion spaced from the integrated circuit component; at least one electronic component coupled to the printed circuit board below the top of the printed circuit board; and at least one heat pipe having an evaporator end adjacent the at least one electronic component, the heat pipe extending away from the evaporator end and along the bottom of the printed circuit board to a condenser end above the top of the printed circuit board, the condenser end being thermally coupled to the passive heat exchanger on the top of the printed circuit board; wherein heat from electronic component is moved away from the electronic component and the integrated circuit component to the passive heat exchanger.

In any combination of the above embodiments of the computing system, the at least one electronic component may be a voltage regulator.

In any combination of the above embodiments of the computing system, the voltage regulator may be coupled to the bottom of the printed circuit board.

In any combination of the above embodiments of the computing system, the computing system may further comprise a substrate between the voltage regulator and the printed circuit board.

In any combination of the above embodiments of the computing system, the computing system further comprises a heat spreader layer adjacent the evaporator end of the at least one heat pipe, and wherein the evaporator end of the at least one heat pipe is embedded within the heat spreader layer.

In any combination of the above embodiments of the computing system the heat spreader layer may be coupled to the voltage regulator.

In any combination of the above embodiments of the computing system the voltage regulator may be coupled to the printed circuit board directly below the integrated circuit component.

In any combination of the above embodiments of the computing system, the computing system comprises a thermal interface material between the heat spreader layer and the voltage regulator.

In any combination of the above embodiments of the computing system the condenser end of the heat pipe may be directly coupled to the passive heat exchanger.

In any combination of the above embodiments of the computing system the passive heat exchanger may be a convection cooled heat sink.

In other embodiments, a cooling system for a computing device, such as the computerized system described in any of the embodiments above, comprises: a printed circuit board having a top and a bottom; an integrated circuit component coupled to the top of the printed circuit board; a heat sink coupled to the top of the printed circuit board and spaced from the integrated circuit component; a voltage regulator coupled to the printed circuit board below the top of the printed circuit board; and at least one heat pipe having an evaporator end adjacent the voltage regulator, the heat pipe extending away from the evaporator end and along the bottom of the printed circuit board to a condenser end above the top of the printed circuit board, the condenser end being thermally coupled to the heat sink on the top of the printed circuit board; wherein heat from voltage regulator is moved away from the voltage regulator and the integrated circuit component to the heat sink.

In any combination of the above embodiments of the cooling system, the cooling system comprises: an air movement system 123 that is operable to provide convection cooling by moving air over the heat sink.

In any combination of the above embodiments of the cooling system, the voltage regulator is coupled to the bottom of the printed circuit board.

In any combination of the above embodiments of the cooling system, the cooling system further comprises a heat spreader layer adjacent the evaporator end of the at least one heat pipe, and wherein the evaporator end of the at least one heat pipe is embedded within the heat spreader layer.

In any combination of the above embodiments of the cooling system, the condenser end of the heat pipe is directly coupled to the heat sink.

In any combination of the above embodiments of the cooling system, the voltage regulator is coupled to the printed circuit board directly below the integrated circuit component.

In other embodiments, a computing system, such as the computing system described in any of the embodiments above, comprises: a chassis; a printed circuit board housed within the chassis, the printed circuit board having a top and a bottom; a central processing unit coupled to the top of the printed circuit board; at least one fan within the chassis that moves air at least over the top of the printed circuit board; a heat sink coupled to the top of the printed circuit board and spaced from the integrated circuit component, the at least one fan moving air over the heat sink; a voltage regulator coupled to the bottom of the printed circuit board; and at least one heat pipe having an evaporator end adjacent the voltage regulator, the heat pipe extending away from the evaporator end and along the bottom of the printed circuit board to a condenser end above the top of the printed circuit board, the condenser end being thermally coupled to the heat sink on the top of the printed circuit board; wherein heat from voltage regulator is moved away from the voltage regulator and the integrated circuit component to the heat sink.

In any combination of the above embodiments of the computing system, further comprising a heat spreader layer adjacent the evaporator end of the at least one heat pipe, and wherein the evaporator end of the at least one heat pipe is embedded within the heat spreader layer.

In any combination of the above embodiments of the computing system, further comprising: a thermal interface material layer disposed on top of the heat spreader layer.

In any combination of the above embodiments of the computing system, the condenser end of the heat pipe may be directly coupled to the heat sink.

Many different arrangements of the various components depicted, as well as components not shown, are possible without departing from the scope of the claims below. Embodiments of the disclosure have been described with the intent to be illustrative rather than restrictive. Alternative embodiments will become apparent to readers of this disclosure after and because of reading it. Alternative means of implementing the aforementioned can be completed without departing from the scope of the claims below. Certain features and sub-combinations are of utility and may be employed without reference to other features and sub-combinations and are contemplated within the scope of the claims.

What is claimed is:

1. A computing system, comprising:
   a printed circuit board having a top and a bottom;
   an integrated circuit component coupled to the top of the printed circuit board;
   a passive heat exchanger coupled to the top of the printed circuit board and having at least a portion spaced from the integrated circuit component;
   at least one electronic component coupled to the printed circuit board (1) below the top of the printed circuit board and (2) directly below the integrated circuit component;
   a single condenser (1) directly thermally coupled to the passive heat exchanger coupled to the top of the printed circuit board and (2) directly thermally coupled to the at least one electronic component coupled to the printed circuit board below the top of the printed circuit board; and
   at least one heat pipe comprising an evaporator portion and a condenser portion and defined as a single conduit between an evaporator end and a condenser end, the evaporator end being adjacent the at least one electronic component, the at least one heat pipe extending away from the evaporator end and along the bottom of the printed circuit board to the condenser end at a first vertical position that is higher than a second vertical position of the top of the printed circuit board, wherein heat from the at least one electronic component is moved away from the at least one electronic component and the integrated circuit component to the passive heat exchanger.

2. The computing system of claim 1, wherein the at least one electronic component is a voltage regulator.

3. The computing system of claim 2, further comprising a substrate between the voltage regulator and the printed circuit board, and wherein the voltage regulator is coupled to the bottom of the printed circuit board.

4. The computing system of claim 1, further comprising a heat spreader layer adjacent the evaporator end of the at least one heat pipe, and wherein the evaporator end of the at least one heat pipe is embedded within the heat spreader layer.

5. The computing system of claim 4, wherein the heat spreader layer is coupled to the at least one electronic component.

6. The computing system of claim 1, further comprising a thermal interface material between (1) a heat spreader layer adjacent the evaporator end of the at least one heat pipe and (2) the at least one electronic component.

7. The computing system of claim 1, wherein the condenser end of the at least one heat pipe is directly coupled to the passive heat exchanger.

8. The computing system of claim 1, wherein the passive heat exchanger is a convection cooled heat sink.

9. The computing system of claim 1, wherein the evaporator portion and the condenser portion are substantially parallel to each other and positioned at different vertical positions along a common vertical plane.

10. The computing system of claim 1, wherein the single condenser is embedded within and in directed thermal contact with a second portion of the passive heat exchanger.

11. The computing system of claim 1, wherein the at least one electronic component is coupled to the printed circuit board directly below the integrated circuit component with or without an intervening component between the at least one electronic component and the printed circuit board.

12. A cooling system for a computing device, comprising:
   a printed circuit board having a top and a bottom;
   an integrated circuit component coupled to the top of the printed circuit board;
   a heat sink coupled to the top of the printed circuit board and spaced from the integrated circuit component;

a voltage regulator coupled to the printed circuit board (1) below the top of the printed circuit board and (2) directly below the integrated circuit component;

a single condenser (1) directly thermally coupled to the heat sink coupled to the top of the printed circuit board and (2) directly thermally coupled to the voltage regulator coupled to printed circuit board below the top of the printed circuit board; and at least one heat pipe comprising an evaporator portion and a condenser portion and defined as a single conduit between an evaporator end and a condenser end, the evaporator end adjacent the voltage regulator, the heat pipe extending away from the evaporator end and along the bottom of the printed circuit board to the condenser end at a first vertical position that is higher than a second vertical position of the top of the printed circuit board, wherein heat from the voltage regulator is moved away from the voltage regulator and the integrated circuit component to the heat sink.

13. The cooling system of claim 12, further configured to provide convection cooling by moving air over the heat sink.

14. The cooling system of claim 12, further comprising a heat spreader layer adjacent the evaporator end of the at least one heat pipe, and wherein the evaporator end of the at least one heat pipe is embedded within the heat spreader layer.

15. The cooling system of claim 14, wherein the condenser end of the at least one heat pipe is directly coupled to the heat sink.

16. The cooling system of claim 12, wherein the voltage regulator is coupled to the printed circuit board directly below the integrated circuit component with or without an intervening component between the voltage regulator and the printed circuit board.

17. A computing system, comprising:
a chassis;
a printed circuit board housed within the chassis, the printed circuit board having a top and a bottom;
a central processing unit coupled to the top of the printed circuit board;
at least one fan within the chassis that moves air at least over the top of the printed circuit board;
a heat sink coupled to the top of the printed circuit board and spaced from the central processing unit, the at least one fan moving air over the heat sink;
a voltage regulator coupled to the bottom of the printed circuit board and directly below the central processing unit;
a single condenser (1) directly thermally coupled to the heat sink coupled to the top of the printed circuit board and (2) directly thermally coupled to the voltage regulator coupled to the bottom of the printed circuit board; and
at least one heat pipe comprising an evaporator portion and a condenser portion and defined as a single conduit between an evaporator end and a condenser end, the evaporator end adjacent the voltage regulator, the at least one heat pipe extending away from the evaporator end and along the bottom of the printed circuit board to the condenser end at a first vertical position that is higher than a second vertical position of the top of the printed circuit board, wherein heat from the voltage regulator is moved away from the voltage regulator and the central processing unit to the heat sink.

18. The computing system of claim 17, further comprising: a heat spreader layer adjacent the evaporator end of the at least one heat pipe, and wherein the evaporator end of the at least one heat pipe is embedded within the heat spreader layer.

19. The computing system of claim 18, further comprising: a thermal interface material layer disposed on top of the heat spreader layer.

20. The computing system of claim 19, wherein the condenser end of the at least one heat pipe is directly coupled to the heat sink.

* * * * *